(12) United States Patent
Huang et al.

(10) Patent No.: US 11,744,055 B2
(45) Date of Patent: Aug. 29, 2023

(54) ELECTRICALLY CONDUCTIVE MULTILAYER FILM AND GASKET

(71) Applicant: 3M INNOVATIVE PROPERTIES COMPANY, St. Paul, MN (US)

(72) Inventors: Bing Huang, Shanghai (CN); Su Zhang, Shanghai (CN); Xin Zhang, Shanghai (CN); Jing Fang, Shanghai (CN); Fan Gao, Shanghai (CN)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 17/606,697

(22) PCT Filed: May 13, 2019

(86) PCT No.: PCT/CN2019/086590
§ 371 (c)(1),
(2) Date: Oct. 26, 2021

(87) PCT Pub. No.: WO2020/227881
PCT Pub. Date: Nov. 19, 2020

(65) Prior Publication Data
US 2022/0217877 A1    Jul. 7, 2022

(51) Int. Cl.
*H05K 9/00* (2006.01)
(52) U.S. Cl.
CPC ......... *H05K 9/0015* (2013.01); *H05K 9/0084* (2013.01)
(58) Field of Classification Search
CPC .................................................. H05K 9/0015
See application file for complete search history.

(56) References Cited

U.S. PATENT DOCUMENTS

| 9,119,285 B2 | 8/2015 | Tarkington |
| 2003/0173100 A1* | 9/2003 | Flaherty ................. H05K 5/061 174/359 |

(Continued)

FOREIGN PATENT DOCUMENTS

| CN | 201514773 | 6/2010 |
| JP | 2013110280 A | 6/2013 |
| WO | WO 1995-02953 | 1/1995 |

OTHER PUBLICATIONS

International Search report for PCT International Application No. PCT/CN2019/086590 dated Feb. 19, 2020, 4 pages.

*Primary Examiner* — Hung V Ngo
(74) *Attorney, Agent, or Firm* — Clifton F. Richardson (57) ABSTRACT

An electrically conductive multilayer film for providing an electrical path between two conductive surfaces includes a plastic backing layer, an electrically conductive layer disposed on a first side of the plastic backing layer, and a recovery layer disposed on an opposite second side of the plastic backing layer. An average thickness of the multilayer film is less than about 100 microns. A hollow gasket can be formed from the multilayer film by winding or bending the multilayer film into a flexible hollow closed loop. When the multilayer film is wound to form a flexible closed loop having an outside diameter of no more than about 7 mm with the conductive layer forming an outside layer of the loop, a resistance of the closed loop across a diameter of the closed loop remains less than about 2Ω when the loop is compressed across the diameter by at least 20%.

18 Claims, 9 Drawing Sheets

(56) References Cited

U.S. PATENT DOCUMENTS

| | | | |
|---|---|---|---|
| 2006/0098387 A1* | 5/2006 | Chandra | F16J 15/064 |
| | | | 361/303 |
| 2008/0149901 A1* | 6/2008 | Choi | H01B 1/24 |
| | | | 252/514 |
| 2012/0012382 A1* | 1/2012 | McBain | B32B 38/00 |
| | | | 156/60 |
| 2013/0333919 A1 | 12/2013 | Nguyen | |
| 2013/0335285 A1 | 12/2013 | Tarkington | |
| 2014/0063773 A1 | 3/2014 | Gilbert | |
| 2014/0216806 A1* | 8/2014 | Poulsen | H05K 9/0015 |
| | | | 174/351 |

* cited by examiner

ELECTRICALLY CONDUCTIVE MULTILAYER FILM AND GASKET

CROSS REFERENCE TO RELATED APPLICATIONS

This application is a national stage filing under 35 U.S.C. 371 of PCT/CN2019/086590, filed May 13, 2019, the disclosure of which is incorporated by reference in its entirety herein.

BACKGROUND

Electronic devices may use conductive gaskets to form electrical paths between opposing conductive structures.

SUMMARY

In some aspect of the present description, an electrically conductive multilayer film for providing an electrical path between two conductive surfaces is provided. The multilayer film includes a plastic backing layer, an electrically conductive layer disposed on a first side of the plastic backing layer, and a recovery layer disposed on an opposite second side of the plastic backing layer. An average thickness of the multilayer film is less than about 100 microns. When the multilayer film is wound to form a flexible closed loop having an outside diameter of no more than about 7 mm with the conductive layer forming an outside layer of the loop, a resistance of the closed loop across a diameter of the closed loop remains less than about 2Ω when the loop is compressed across the diameter by at least 20%.

In some aspect of the present description, a hollow gasket formed by winding a multilayer film in a shape of a flexible hollow loop and bonding first and second portions of opposing first and second sides of the multilayer film to each other to form a flexible hollow closed loop is provided. The multilayer film has an average thickness less than about 40 microns. The multilayer film includes an electrically conductive layer forming an outermost layer of the closed loop, and a recovery layer disposed on the conductive layer and including an acrylic polymer. The hollow gasket regains at least 40% of its initial diameter after a force compressing the gasket across the initial diameter by more than about 50% is removed.

In some aspect of the present description, a hollow gasket formed by bending a multilayer film in a shape of a flexible hollow loop and bonding first and second portions of a same side of the multilayer film to each other to form a flexible hollow closed loop is provided. The multilayer film has an average thickness less than about 40 microns. The multilayer film includes an electrically conductive layer forming an outermost layer of the closed loop, and a recovery layer disposed on the conductive layer and including an acrylic polymer. The hollow gasket regains at least 40% of its initial diameter after a force compressing the gasket across the initial diameter by more than about 80% is removed.

In some aspects of the present description, an electronic device is provided. The electronic device includes electrically conductive first and second surfaces spaced apart along a first direction and facing each other, and a first compressed cylinder disposed between the first and second surfaces. The first compressed cylinder extends along a longitudinal second direction orthogonal to the first direction and includes an electrically conductive external layer disposed on an electrically insulative internal layer comprising a reaction product of a composition containing a cyclic side-chain acrylate, an acrylic block copolymer, and a crosslinking agent. The external layer provides an electrically conductive path between the first and second surfaces by virtue of making electrical and physical contact with the first and second surfaces. The first compressed cylinder has an outer dimension D1 along the first direction and a longer outer dimension D3 along a third direction orthogonal to the first and second directions, where D3/D1≥1.2.

DETAILED DESCRIPTION in the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

Electronic devices may use conductive gaskets to form electrical paths between opposing conductive structures as generally described in U.S. Pat. No. 9,119,285 (Tarkington et al.), for example. According to some embodiments of the present description, a conductive gasket may be made from a multilayer film having a layer structure that provides improved electrical performance (e.g., providing a low electrical resistance and maintaining a low resistance when compressed) and/or improved mechanical performance (e.g., improved recovery after a force compressing the gasket is removed) compared to conventional conductive gaskets.

In some embodiments, a multilayer film includes at least two layers where one of the layers is an electrically conductive layer and the other of the two layers is at least one of a recovery layer or an electrically insulative layer. In some embodiments, when the multilayer film is wound to form a closed loop and the loop is compressed, the recover layer helps the closed loop to recover at least a substantial portion of its initial uncompressed shape. The recovery layer may be an electrically insulative layer and/or may be formed from compositions described herein. In some embodiments, the multilayer film further includes a plastic backing layer disposed between the electrically conductive layer and the recovery layer. It has been found, according to some embodiments, that a recovery layer of a multilayer film used to form a hollow gasket can be selected (e.g., by forming the recovery layer from acrylic polymers described elsewhere herein) to provide a desired recovery (e.g., at least 40% or even at least 60% after the gasket is compressed by more than 50%) even when the multilayer film is thin (e.g., less than about 100 microns thick, or even less than about 40 microns thick).

Figure 1:
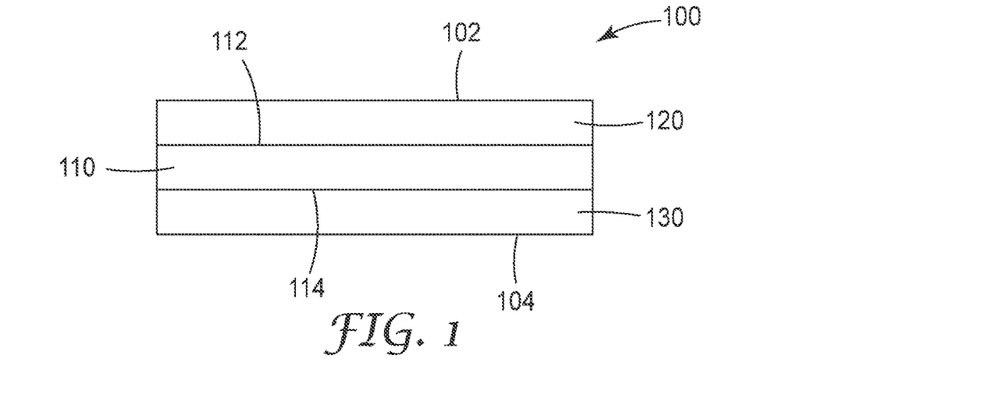
FIG. 1 is a schematic cross-sectional view of an electrically conductive multilayer film.
Figure 6A:
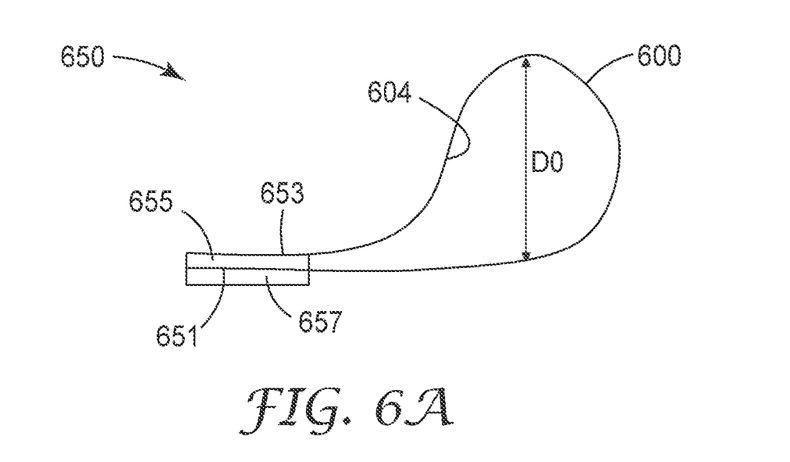
FIG. 6A is a schematic cross-sectional view of a hollow gasket formed by bending a multilayer film.

FIG. 1 is a schematic cross-sectional view of an electrically conductive multilayer film 100 including an electrically conductive layer 120 and a recovery layer 130. In the illustrated embodiment, the multilayer film 100 further includes a plastic backing layer 110. In other embodiments, the electrically conductive layer 120 may be disposed directly on the recovery layer 130. In the illustrated embodiment, the multilayer film includes the plastic backing layer 110, the electrically conductive layer 120 disposed on a first side 112 of the plastic backing layer 110, and the recovery layer 130 disposed on an opposite second side 114 of the plastic backing layer 110. In some embodiments, the multilayer film 100 is suitable for providing an electrical path between two conductive surfaces (see, e.g., FIG. 6). In some embodiments, an average thickness (e.g., an unweighted mean over the area of the film of the film thickness) of the multilayer film 100 is less than about 100 microns, or less than about 60 microns, or less than about 50 microns, or less than about 40 microns.

The electrically conductive layer of any multilayer film or gasket or cylinder described herein may be or include a metal, or may be or include an oxide (e.g., indium tin oxide). In some embodiments, the electrically conductive layer includes one or more of copper, nickel, silver, aluminum, gold, indium tin oxide (ITO), and tin. For example, the electrically conductive layer 120 may be a metal layer plated onto the first side 112 of the plastic backing layer 110 or may be a conductive coating (e.g., and indium tin oxide coating) applied onto the first side 112 of the plastic backing layer 110. The plastic backing layer 110 may be any suitable plastic layer such as a polyethylene terephthalate (PET) substrate or a polyimide substrate, for example. The recovery layer 130 may be formed by applying a coating onto the second side 114 of the plastic backing layer 110 and then curing the coating.

Figure 2A:
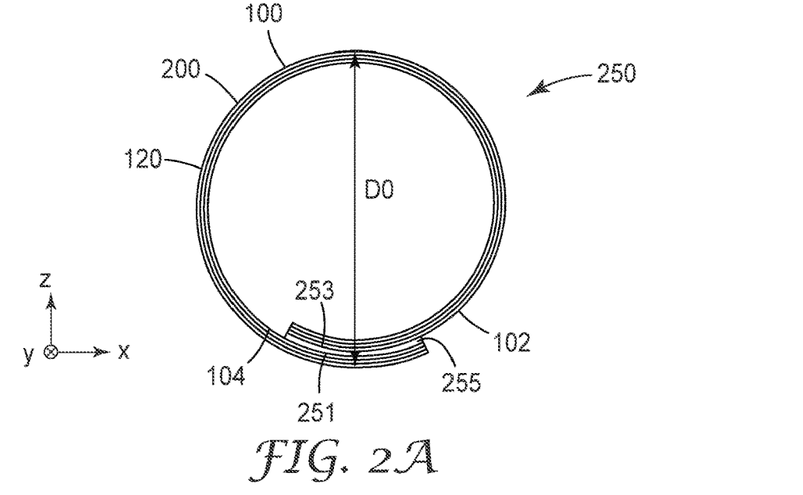
FIG. 2A is a schematic cross-sectional view of a multilayer film wound to form a flexible closed loop.
Figure 2B:
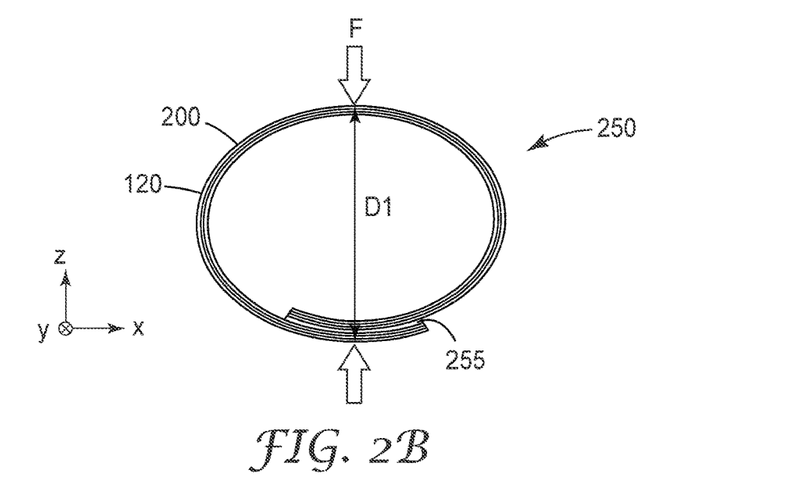
FIG. 2B is a schematic cross-sectional view of the flexible closed loop of FIG. 2A after it has been compressed across its diameter.

FIG. 2A is a schematic cross-sectional view of the multilayer film 100 wound to form a flexible closed loop 200 having an outside diameter D0 with the conductive layer 120 forming an outside layer of the loop 200. In some embodiments, the outside diameter D0 is no more than about 7 mm, or no more than about 5 mm, or no more than about 3 mm, or no more than about 2 mm. In some, the outside diameter D0 is at least about 0.2 mm, or at least about 0.5 mm, or at least about 1 mm, or at least about 2 mm, or at least about 3 mm, or at least about 4 mm. In some embodiments, the outer diameter D1 is in a range from any one of these lower limits to any one of the upper limits greater than the lower limit. FIG. 2B is the flexible closed loop 200 after it has been compressed across the diameter to a smaller outer diameter D0. D0 may be compressed (e.g., by a force F as schematically illustrated in FIG. 2B) to D1 by at least about 20% ((D0−D1)/D0*100% at least about 20%), or at least about 50%, or at least about 60%, or at least about 70%, or at least about 80%, or at least about 90%, or in a range between any two of these compressions (e.g., in a range from about 20% to about 50%/). In some embodiments, when the multilayer film 100 is wound to form the flexible closed loop 200 having the outside diameter D0 with the conductive layer 120 forming an outside layer of the loop 200, a resistance of the closed loop 200 across a diameter of the closed loop remains less than about 2Ω when the loop is compressed across the diameter by at least 20%. In some embodiments, the resistance of the closed loop 200 across a diameter of the closed loop remains less than about 1Ω, or less than about 0.5Ω, or less than about 0.4Ω, or less than about 0.3Ω when the loop is compressed across the diameter by at least 20%. In some embodiments, the resistance of the closed loop across the diameter of the closed loop changes by less than about 50% when the compression of the loop is changed from about 20/to about 50%.

The thickness and/or modulus of the various layers (e.g., of the recovery layer) can be selected to provide a desired compression when a specified force or ranges of force is applied. In some embodiments, a compression force F of less than about 0.4 kg applied across the diameter, compresses the loop 200 across the diameter by more than about 80%. In some embodiments, a compression force per unit length of the loop of less than about 16 kg/m, or less than about 15 kg/m, applied across the diameter along the length of the loop compresses the loop across the diameter by more than about 80%. The compression force per unit length is the force F (see. e.g., FIG. 28) divided by the length L (see, e.g., FIG. 3A or 3B). In some embodiments, the closed loop 200 regains at least 40% of its initial diameter D0 after a force compressing the closed loop 200 across the initial diameter by more than about 50%, or more than about 60%, or more than about 60%, or more than about 70%, or more than about 80%, or more than about 90% is removed. In some embodiments, the closed loop 200 regains at least 40% of its initial diameter after a compression force F of about 2 kg applied across the initial diameter of the closed loop 200 is removed. In some embodiments, the closed loop 200 regains at least 40% of its initial diameter after a compression force per unit length of the closed loop 200 of about 79 kg/m, or about 80 kg/m, applied across the initial diameter of the closed loop 200 along the length of the closed loop 200 is removed. In some embodiments, the closed loop 200 regains at least 50%, or at least 60%, or at least 65%, or at least 70% of its initial diameter D0 after the force F or the force per unit length is removed.

In some embodiments, when the multilayer film 100 is first aged for more than about 50 hours at a temperature of about 85° C. and a relative humidity of about 85% and then the multilayer film 100 is wound to form a flexible closed loop 200 having an outside diameter D0 of no more than about 7 mm with the conductive layer forming an outside layer of the loop 200, the closed loop 200 regains at least 40% of its initial diameter D0 after a force F compressing the closed loop 200 across the initial diameter by more than about 50% is removed. In some embodiments, the closed loop is compressed across the initial diameter by more than about 60%, or more than about 60%, or more than about 70%, or more than about 80%, or more than about 90%. In some embodiments, the closed loop regains at least 50%, or at least 60%, or at least 65%, or at least 70% of its initial diameter D0 after the force F is removed.

In some embodiments, a hollow gasket 250 is formed by winding a multilayer film (e.g., multilayer film 100 or other multilayer film described elsewhere) in a shape of a flexible hollow loop 200 and bonding first and second portions 253 and 251 of opposing first and second sides of the multilayer film (e.g., sides 102 and 104 of the multilayer film 100) to each other to form the flexible hollow closed loop 200. The first and second portions 253 and 251 may be bonded to each other via an adhesive 255 which may be an electrically conductive adhesive. In other embodiments, a hollow gasket (see, e.g., FIG. 6A) is formed by bending the multilayer film in a shape of a flexible hollow loop and bonding first and second portions of a same side of the multilayer film (e.g., side 104 of the multilayer film 100) to each other to form the flexible hollow closed loop. In the embodiment schematically illustrated in FIGS. 2A-2B, the gasket 250 is formed using multilayer film 100. In some embodiments, the hollow gasket 250 is formed using a multilayer film having an average thickness less than about 40 microns and including an electrically conductive layer forming an outermost layer of the closed loop, and a recovery layer disposed on the conductive layer and including an acrylic polymer. In some embodiments, the recovery layer is disposed indirectly on the conductive layer and a plastic layer is disposed between the recovery layer and the conductive layer. In some embodiments, the hollow gasket 250 regains at least 40% (or other recovery percentages described elsewhere herein) of its initial diameter D0 after a force compressing the gasket 250 across the initial diameter D0 by more than about 50% (or other compression percentages described elsewhere herein) is removed.

Figure 3A:
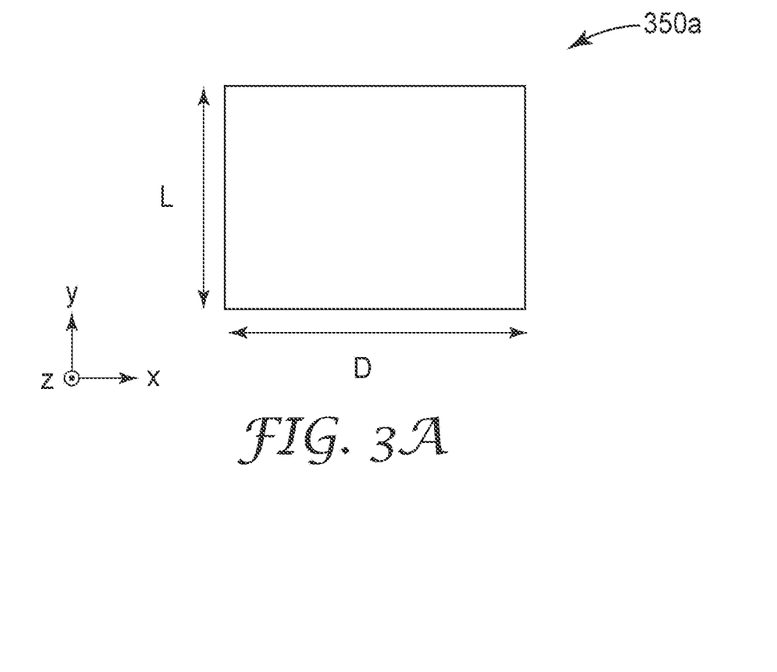
FIGS. 3A-3B are schematic top view of hollow gaskets
Figure 3B:
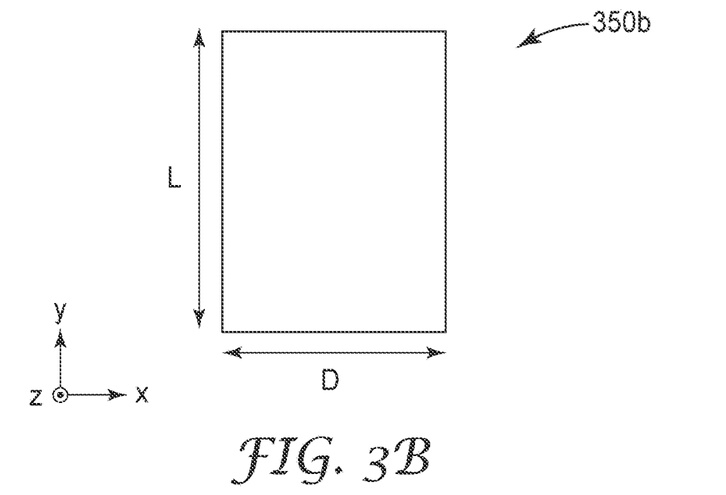

FIGS. 3A-3B are schematic top view of hollow gaskets 350a and 350b, respectively, either of which may correspond to hollow gasket 250 or other hollow gaskets described elsewhere herein. The hollow gaskets have a length L and a diameter D (e.g., corresponding to an initial diameter D0). The length L and diameter D may be selected as desired for a given application. For hollow gasket 350a, L/D<1 and for hollow gasket 350b, L/D>1. In some embodiments, L/D is greater than about 0.5, or greater than about 1, or greater than about 2. In some such embodiments or in other embodiments, L/D is less than about 20, or less than about 10.

Figure 4:
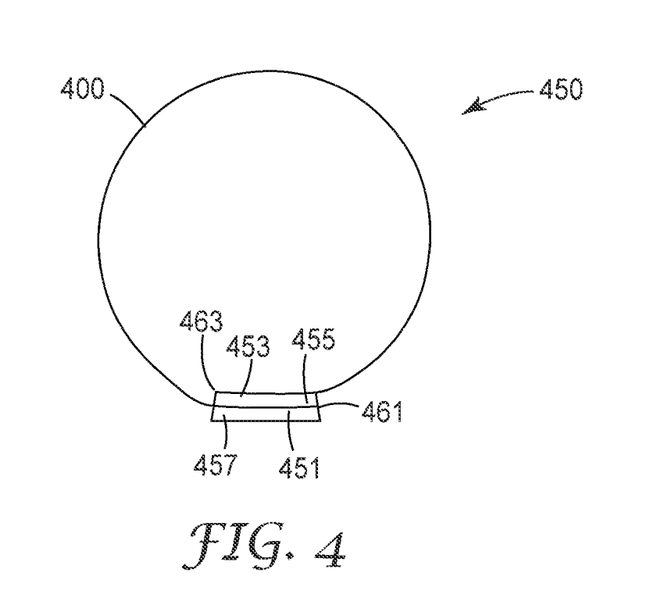
FIGS. 4-5 are schematic cross-sectional views of a hollow gaskets formed by winding multilayer films.

FIG. 4 is a schematic cross-sectional view of a hollow gasket 450 formed by winding a multilayer film (e.g., multilayer film 100 or other multilayer film described elsewhere) in a shape of a flexible hollow loop 400 and bonding first and second portions 453 and 451 of opposing first and second sides of the multilayer film (e.g., sides 102 and 104 of the multilayer film 100) to each other to form the flexible hollow closed loop 400. The first and second portions 453 and 451 may be bonded to each other via an adhesive 455, which may be an electrically conductive adhesive, and an electrically conductive adhesive 457 is included in the illustrated embodiment for bonding and electrically connecting the hollow gasket 450 to a first electrically conductive surface (e.g., a surface of an electrode in an electronic device). A top portion of the loop 400 may contact a second electrically conductive surface so that the multilayer film provides an electrical path between the two conductive surfaces. The first and second portions 453 and 451 are adjacent respective first and second opposite edges 463 and 461 of the multilayer film.

Figure 5:
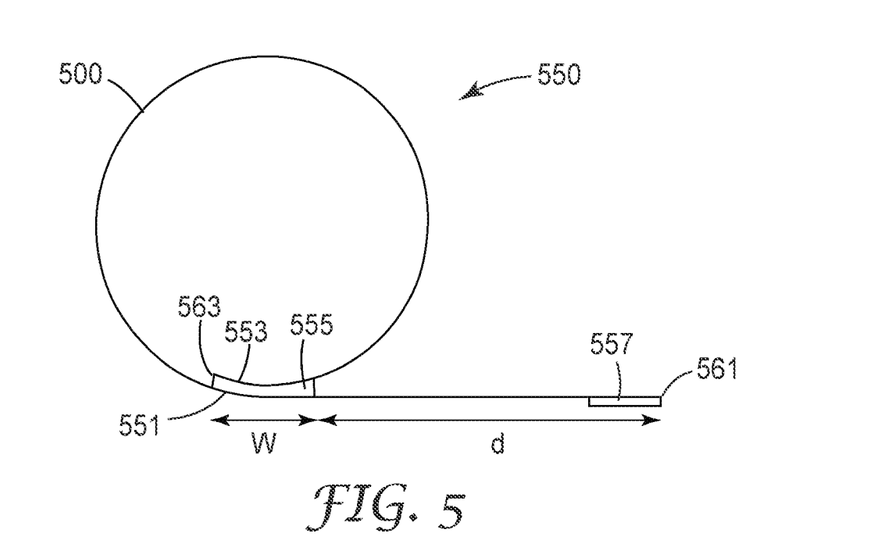

FIG. 5 is a schematic cross-sectional view of a hollow gasket 550 formed by winding a multilayer film (e.g., multilayer film 100 or other multilayer films described elsewhere) in a shape of a flexible hollow loop 500 and bonding first and second portions 553 and 551 of opposing first and second sides of the multilayer film (e.g., sides 102 and 104 of the multilayer film 100) to each other to form the flexible hollow closed loop 500. The first and second portions 553 and 551 may be bonded to each other via an adhesive 555 which may be an electrically conductive adhesive. The first portion 553 is adjacent a first edge 563 of the multilayer film and an opposite second edge 561 of the multilayer film is spaced apart from the second portion 551 by a distance d greater than a width W of the second portion 551. An adhesive 557 is included adjacent second edge 561 for bonding the hollow gasket to a substrate. In some embodiments, the hollow loop is used to electrically connect electrically conductive first and second surfaces and the adhesive 557 bonds the hollow loop to an electrically insulative substrate adjacent at least one of the first and second surfaces. In some embodiments, the adhesive 557 is electrically insulative.

Figure 6B:
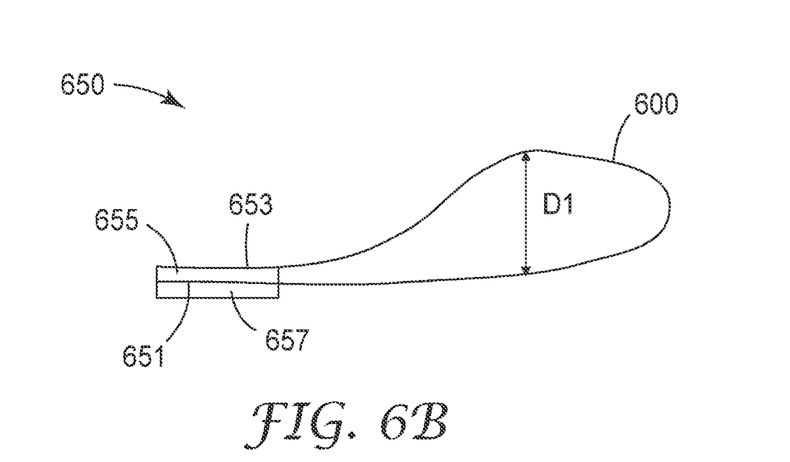
FIG. 6B is a schematic cross-sectional view of the hollow gasket of FIG. 6A after it has been compressed across its diameter.

FIG. 6A is a schematic cross-sectional view of a hollow gasket 650 formed by bending a multilayer film (e.g., multilayer film 100 or other multilayer films described elsewhere) in a shape of a flexible hollow loop 600 and bonding first and second portions 653 and 651 of a same side 604 (e.g., corresponding to side 104 of multilayer film 100) of the multilayer film to each other to form a flexible hollow closed loop 600. As described further elsewhere herein, in some embodiments, the multilayer film has an average thickness less than about 40 microns and includes an electrically conductive layer forming an outermost layer of the closed loop 600; and a recovery layer disposed on the conductive layer and including an acrylic polymer. The first and second portions 653 and 651 may be bonded to each other via an adhesive 655. In the illustrated embodiment, the first and second portions 653 and 651 are adjacent edges of the multilayer film. In other embodiments, one of the first and second portions 653 and 651 may be spaced apart from an edge of the multilayer film to provide a film segment having a length d (see FIG. 5). In some embodiments, an electrically conductive adhesive layer 657 for bonding the hollow gasket 650 to an electrically conductive surface is included. FIG. 68 is a schematic cross-sectional view of hollow gasket 650 after it has been compressed across its initial diameter D0 to a compressed diameter D1. In some such embodiments, the hollow gasket 650 regains at least 40% (in some embodiments, at least 50%, or at least 60%, or at least 70%, or at least 75%) of its initial diameter D0 after a force compressing the gasket across the initial diameter D0 by more than about 80% (e.g., about 85%) is removed.

Figure 7:
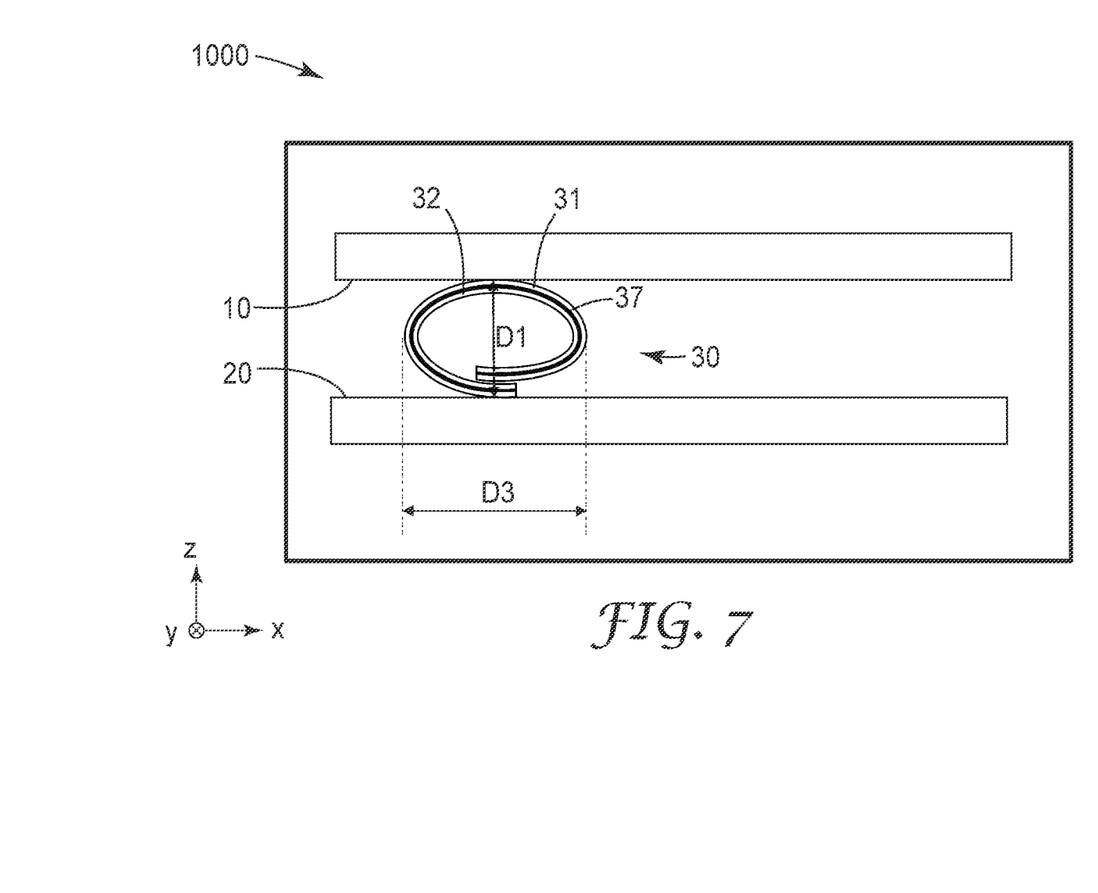
FIG. 7 is a schematic cross-sectional view of an electronic device including a compressed cylinder.

FIG. 7 is a schematic cross-sectional view of an electronic device 1000 including electrically conductive first and second surfaces 10 and 20 spaced apart along a first direction (z-direction) and facing each other. The electronic device 1000 further includes a first compressed cylinder 30 disposed between the first and second surfaces 10 and 20. The first compressed cylinder 30 (which may correspond to gasket 350a or 350b, for example) extends along a longitudinal second direction (y-direction) orthogonal to the first direction (z-direction) and includes an electrically conductive external layer 31 disposed on an electrically insulative internal layer 32. The first compressed cylinder 30 may correspond to any hollow gasket described elsewhere herein and/or may be formed from any multilayer film described elsewhere herein. For example, the cylinder 30 may be formed by winding a multilayer film to form a cylinder and may include overlapping portions as described further elsewhere herein. The electrically conductive external layer 31 may include a metal layer, for example, and may further include an electrically conductive adhesive proximate at least one of the first and second surfaces 10 and 20 to electrically connect the metal layer to the surface. The electrically insulative internal layer 32 may be a recovery layer as described elsewhere herein. A plastic layer 37 may be disposed between the external layer 31 and the internal layer 32. In some embodiments, the electrically insulative internal layer 32 is formed from a reaction product of a composition including a cyclic side-chain acrylate, an acrylic block copolymer, and a crosslinking agent. The internal layer 32 may be any recovery layer described elsewhere herein. In some embodiments, the external layer 31 provides an electrically conductive path between the first and second surfaces 10 and 20 by virtue of making electrical and physical contact with the first and second surfaces 10 and 20. In some embodiments, the first compressed cylinder has an outer dimension D1 along the first direction and a longer outer dimension D3 along a third direction (x-direction) orthogonal to the first and second directions. In some embodiments, D3/D1≥1.2, or D3/D1≥1.5, or D3/D1≥2.

Figure 8:
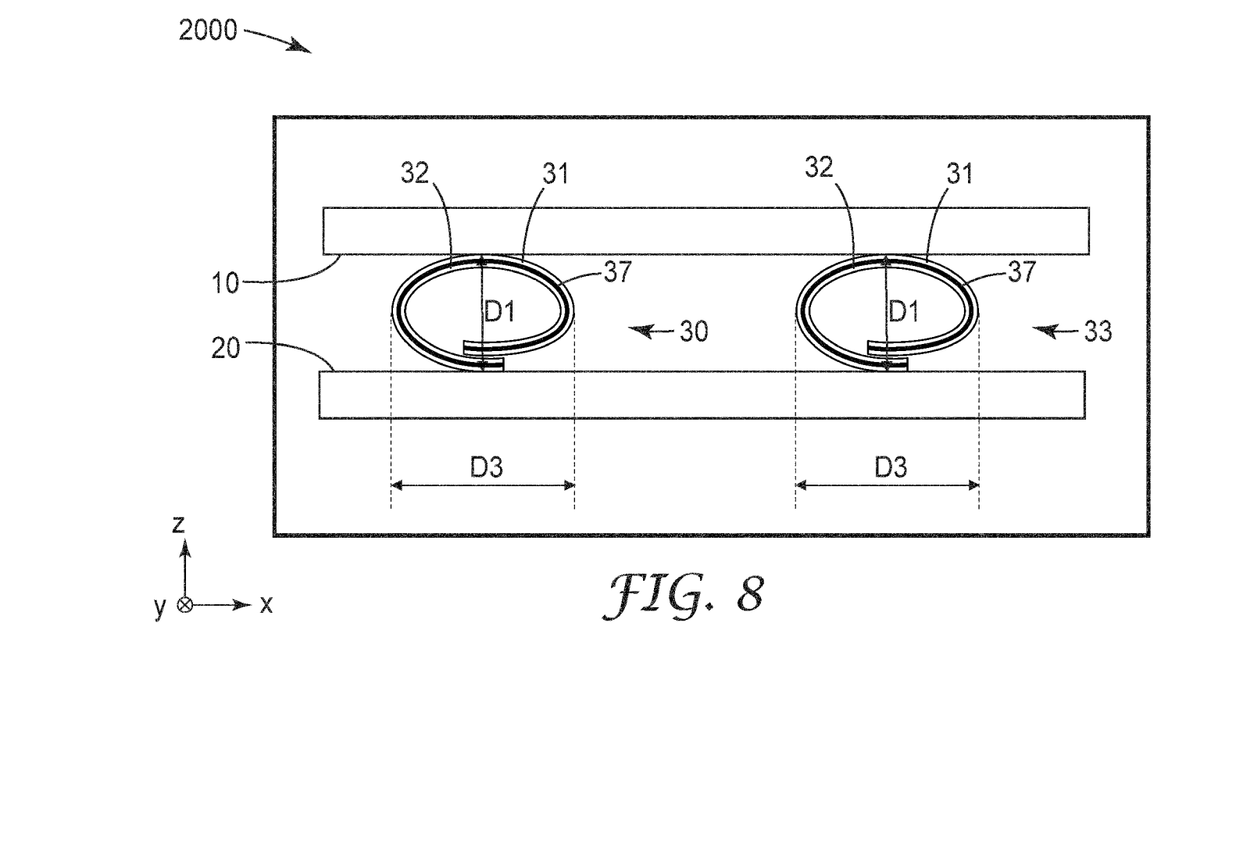
FIG. 8 is a schematic cross-sectional view of an electronic device including two compressed cylinders.

In some embodiments, the electronic device 1000 further includes a second compressed cylinder. This is schematically illustrated in FIG. 8 which is a schematic cross-sectional view of an electronic device 2000 that corresponds to electronic device 1000 except that a second compressed cylinder 33 is between the first and second surfaces 10 and 20. The second compressed cylinder may be as described for the first compressed cylinder. Additional compressed cylinders may also be included.

The recovery layer of any multilayer film or gasket described herein may include an acrylic polymer. In some embodiments, the acrylic polymer is or includes an acrylic block copolymer.

In some embodiments, the acrylic polymer is or includes a blend of at least two different acrylic block copolymers. The two different acrylic block copolymers may have different Young's moduli and/or different glass transition temperatures and the blend may be selected to adjust elastic properties (e.g., Young's modulus) of the recovery layer. Suitable acrylic block copolymers include those available under the tradename KURARITY from Kuraray (Tokyo, Japan).

In some embodiments, the acrylic polymer is or includes a reaction product of a composition including a cyclic side-chain acrylate, an acrylic block copolymer, and a crosslinking agent. In some embodiments, the cyclic side-chain acrylate is included to adjust the elastic properties (e.g., Young's modulus), for example, of the recovery layer. The cyclic side-chain acrylate may be or include isobornyl acrylate, for example. In some embodiments, the acrylic block copolymer and the cyclic side-chain acrylate are included in the composition at a parts by weight ratio in a range from about 1:4 to about 1:0.1.

In some embodiments, the acrylic polymer is or includes a reaction product of a composition including a radical polymerizable acid, a free radical polymerizable base, and a crosslinking agent. Hydrogen bonding between acid and base agents may result in a layer with a desired modulus and recovery. In some embodiments, the ratio of acid to base is adjusted to produce desired elastic properties (e.g., Young's modulus). In some embodiments, the parts by weight ratio of acid to base is in a range from about 1:1 to about 2:1. In some embodiments, the acid is a Lewis acid and the base is a Lewis base. In some embodiments, the radical polymerizable acid includes acrylic acid and at least one of ethyl acrylate or methacrylate. In some embodiments, the radical polymerizable base includes methyl methacrylate and 2-(dimethylamino)ethyl methacrylate. In some embodiments, the composition includes acrylic acid, methyl methacrylate, 2-(dimethylamino)ethyl methacrylate, a crosslinking agent, and at least one of ethyl acrylate or methyl acrylate.

In some embodiments, the curing agent used in the composition used to make the acrylic polymer includes at least one of multifunctional amide or an isocyanate. The multifunctional amide may be a bisimide (e.g., an aromatic bisimide) or a triamide, for example. The isocyanate may be an aromatic polyisocyanate, for example.

In some embodiments, the composition used to make the acrylic polymer further includes an organosilane. The organosilane may tend to migrate to a major surface of the recovery layer opposite the electrically conductive layer and this may be used to prevent an inner surface of a hollow gasket, for example, from sticking to itself.

The following is a list of illustrative embodiments.

In a first embodiment, an electrically conductive multilayer film for providing an electrical path between two conductive surfaces comprises:

a plastic backing layer;

an electrically conductive layer disposed on a first side of the plastic backing layer; and a recovery layer disposed on an opposite second side of the plastic backing layer, such that an average thickness of the multilayer film is less than about 100 microns, and when the multilayer film is wound to form a flexible closed loop having an outside diameter of no more than about 7 mm with the conductive layer forming an outside layer of the loop, a resistance of the closed loop across a diameter of the closed loop remains less than about 2Ω when the loop is compressed across the diameter by at least 20%.

A second embodiment is the electrically conductive multilayer film of the first embodiment, wherein the resistance of the closed loop across the diameter of the closed loop changes by less than about 50% when the compression of the loop is changed from about 20% to about 50%.

A third embodiment is the electrically conductive multilayer film of the first or second embodiments, wherein a compression force per unit length of the loop of less than about 16 kg/m applied across the diameter along the length of the loop, compresses the loop across the diameter by more than about 80%.

A fourth embodiment is the electrically conductive multilayer film of any of the first through third embodiments, wherein the closed loop regains at least 40% of its initial diameter after a force compressing the closed loop across the initial diameter by more than about 50%.

A fifth embodiment is the electrically conductive multilayer film of any of the first through fourth embodiments, wherein the closed loop regains at least 40% of its initial diameter after a compression force per unit length of the closed loop of about 79 kg/m applied across the initial diameter of the closed loop along the length of the closed loop is removed.

A sixth embodiment is the electrically conductive multilayer film of any of the first through fifth embodiments, wherein the resistance of the closed loop across a diameter of the closed loop remains less than about 1Ω when the loop is compressed across the diameter by at least 20%.

A seventh embodiment is the electrically conductive multilayer film of any of the first through sixth embodiments, wherein the electrically conductive layer comprises one or more of copper, nickel, silver, aluminum, gold, indium tin oxide (ITO), and tin.

An eight embodiment is the electrically conductive multilayer film of any of the first through seventh embodiments, wherein the recovery layer comprises an acrylic polymer.

In a ninth embodiment, a hollow gasket formed by winding a multilayer film in a shape of a flexible hollow loop and bonding first and second portions of opposing first and second sides of the multilayer film to each other to form a flexible hollow closed loop is provided. The multilayer film has an average thickness less than about 40 microns and comprises:

an electrically conductive layer forming an outermost layer of the closed loop; and a recovery layer disposed on the conductive layer and comprising an acrylic polymer, such that the hollow gasket regains at least 40% of its initial diameter after a force compressing the gasket across the initial diameter by more than about 50% is removed.

A tenth embodiment is the hollow gasket of the ninth embodiment, wherein the first and second portions are adjacent respective first and second opposing edges of the multilayer film.

An eleventh embodiment is the hollow gasket of the ninth or tenth embodiments, wherein the first portion is adjacent a first edge of the multilayer film and an opposing second edge of the multilayer film is spaced apart from the second portion by a distance greater than a width of the second portion.

In a twelfth embodiment, a hollow gasket formed by bending a multilayer film in a shape of a flexible hollow loop and bonding first and second portions of a same side of the multilayer film to each other to form a flexible hollow closed loop is provided. The multilayer film has an average thickness less than about 40 microns and comprises:

an electrically conductive layer forming an outermost layer of the closed loop; and a recovery layer disposed on the conductive layer and comprising an acrylic polymer, such that the hollow gasket regains at least 40% of its initial diameter after a force compressing the gasket across the initial diameter by more than about 80% is removed.

A thirteenth embodiment is the hollow gasket of any of the ninth through twelfth embodiments or the electrically conductive multilayer film of any of the first through eight embodiments, wherein the recovery layer comprises a reaction product of a composition comprising a cyclic side-chain acrylate, an acrylic block copolymer, and a crosslinking agent.

A fourteenth embodiment is the hollow gasket of any one of the of the ninth through twelfth embodiments or the electrically conductive multilayer film of the eighth embodiment, wherein the acrylic polymer comprises a reaction product of a composition comprising a radical polymerizable acid, a free radical polymerizable base, and a crosslinking agent.

In a fifteenth embodiment, an electronic device comprises:

electrically conductive first and second surfaces spaced apart along a first direction and facing each other: and a first compressed cylinder disposed between the first and second surfaces, the first compressed cylinder extending along a longitudinal second direction orthogonal to the first direction and comprising an electrically conductive external layer disposed on an electrically insulative internal layer comprising a reaction product of a composition comprising a cyclic side-chain acrylate, an acrylic block copolymer, and a crosslinking agent, wherein the external layer provides an electrically conductive path between the first and second surfaces by virtue of making electrical and physical contact with the first and second surfaces, the first compressed cylinder having an outer dimension D1 along the first direction and a longer outer dimension D3 along a third direction orthogonal to the first and second directions, $D3/D1 \geq 1.2$.

EXAMPLES

Materials

| Material (Abbreviation) | Material (description) | Obtained From |
|---|---|---|
| EA | Ethyl acrylate | Shanghai Huayi (group) Company (China) |
| AA | Acrylic acid | Sinopharm Chemical Reagent (Shanghai, China) |
| MMA | Methyl methacrylate | Shanghai Huayi (group) Company |
| MA | Methyl acrylate | Shanghai Huayi (group) Company |
| IBOA | Isobornyl acrylate | BASF/Osaka Organic Chemistry |
| DMAEMA | 2-(dimethylamino)ethyl methacrylate | Shanghai Huayi (group) Company |
| HTGO | High Tg oligomer prepared from 97 parts by weight of IBOA and 3 parts by weight of AA | |
| LA2250 | KURARITY LA2250 acrylic block copolymer | Kuraray (Tokyo, Japan) |
| LA4285 | KURARITY LA4285 acrylic block copolymer | Kuraray (Tokyo, Japan) |
| Tago | Silane | Evonik industries (Essen, Germany) |
| RD1054 | Crosslinker | 3M Company |
| EtOAc (solvent) | Ethyl acetate | Sinopharm Chemical Reagent |
| IPA (solvent) | Isopropanol | Sinopharm Chemical Reagent |
| DMB (solvent) | Dimethylbenzene | Sinopharm Chemical Reagent |

Preparation of Compositions for Recovery Layer

Adhesive compositions used in the recover layer compositions were prepared as follows: Adhesive 1 was a mixture of 94 parts by weight of EA and 6 parts by weight of AA; Adhesive 2 was a mixture of 94 parts by weight of MAA and 6 parts by weight of DMAEMA; and Adhesive 3 was a mixture of 94 parts by weight of MA and 6 parts by weight of AA.

The recovery layer compositions were prepared as follows:

Recovery Layer Composition A was a mixture of HTGO, LA2250, RD1054. IPA, and DMB. The weight ratio of LA2250 to HTGO was about 1:1. RD1054 was included at 0.1 wt % dry to dry.

Recovery Layer Composition B was a mixture of Adhesive 1, Adhesive 2, RD1054, and IPA. The weight ratio of Adhesive 1 to Adhesive 2 was about 1:1. RD1054 was included at 0.1% dry to dry.

Recovery Layer Composition C was a mixture of Adhesive 3, Adhesive 2, RD1054, and IPA. The weight ratio of Adhesive 3 to Adhesive 2 was 1:1. RD1054 was included at 0.1% dry to dry.

Recovery Layer Composition D was a mixture of LA2250, LA4285, IPA, and DMB. The weight ratio of LA2250 to LA4285 was 1:1.

Recovery Layer Composition E was a mixture of HTGO, LA2250, Tago, RD1054, IPA, and DMB. The weight ratio of LA2250 to HTGO was about 1:1 RD1054 was included at 0.1% dry to dry A small amount (<0.1 wt %) of Tago was also included.

Multilayer films similar to that depicted in FIG. 1 were made by sputtering nickel/copper/nickel layers onto a PET substrate. The total metal thickness was about 1-3 micrometers. Then a recovery layer composition was coated onto the PET substrate and cured to form recovery layer.

Hollow loop gaskets similar to that depicted in FIG. 2A were formed by winding a multilayer film into a loop shape and bonding ends of the multilayer film together to form a closed loop. The outer diameter (e.g., D0 depicted in FIG. 2A) of the loop was about 5.2 mm. The length of the gasket (e.g., the length L depicted in FIGS. 3A-3B) was about 25.4 mm.

Force-Displacement-Resistance (FDR) measurement curves were determined for various samples using a MAX-1 KN-S-2 FDR meter. The force required to press the loop to 0.2 mm was determined for various samples. The percent of the initial diameter that was recovered after a force pressed the loop to 0.2 mm for a duration of about 1 minute and was then removed was determined. The percent of the initial diameter that was recovered after a 2 kg force was applied for a duration of about 1 minute and was then removed was determined. The results are provided in the following table.

| Example | Substrate | Recovery Layer Formula | Total Thickness (μm) | Force to Press to 0.2 mm | Recovery (%) After Pressed to 0.2 mm | Recovery (%) After Pressed with 2 kg |
|---|---|---|---|---|---|---|
| 1 | 12 μm PET | A | 23 | 0.18 | 76 | — |
| 2 | 12 μm PET | B | 27 | 0.28 | 74 | 69 |
| 3 | 12 μm PET | C | 28 | 0.3 | 70 | 59 |
| 4 | 12 μm PET | D | 27 | 0.33 | 68 | 54 |
| C1 | 25 μm PET | None | 25 | 0.35 | 58 | 43 |
| C2 | Polyimide | None | 27 | 0.32 | 59 | 50 |
| C3 | Fabric | None | 27 | 0.26 | 47 | 34 |

Figure 9:
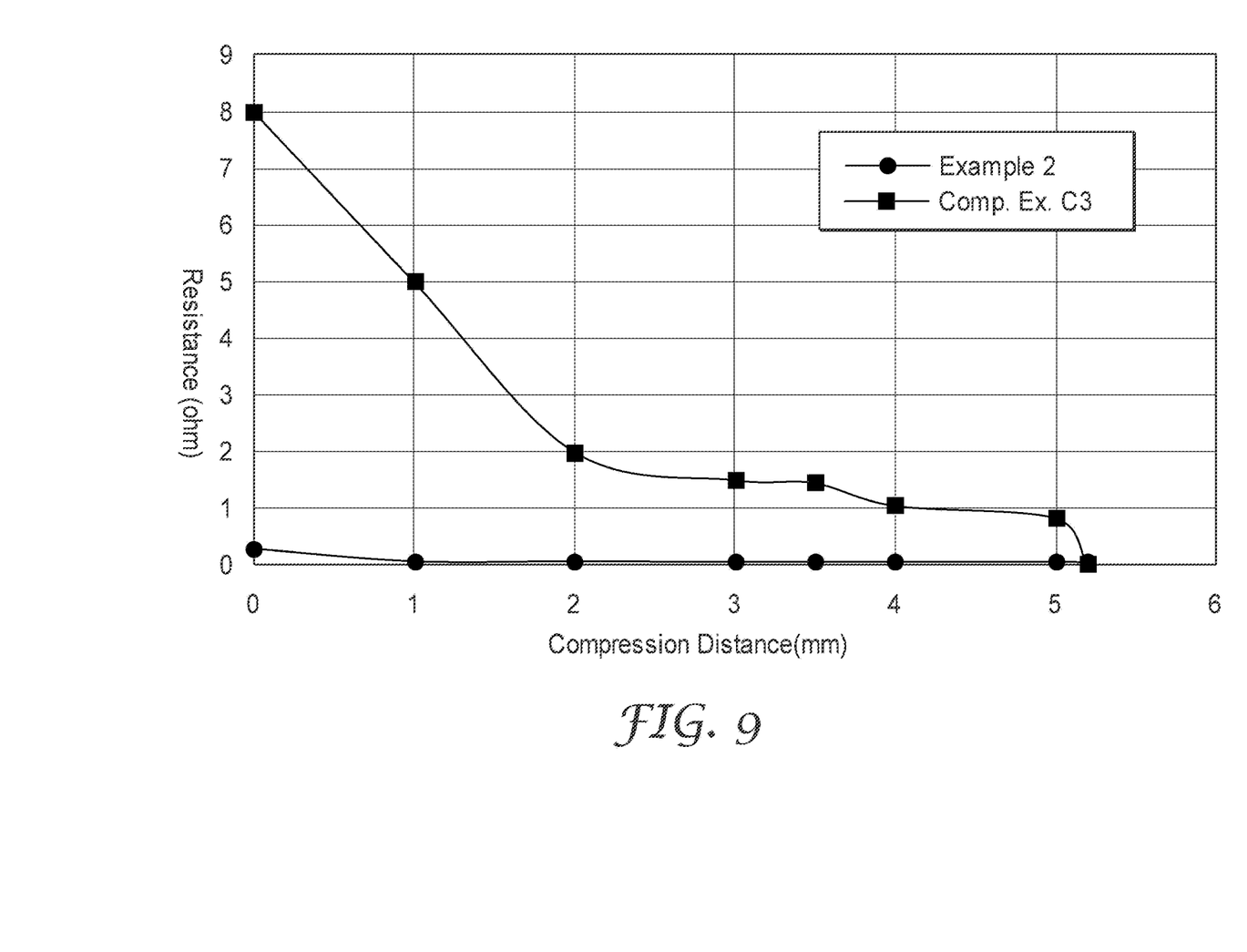
FIG. 9 is plot of the electrical resistance across a closed loop versus compression distance for an example gasket and for a comparative gasket.
Figure 10:
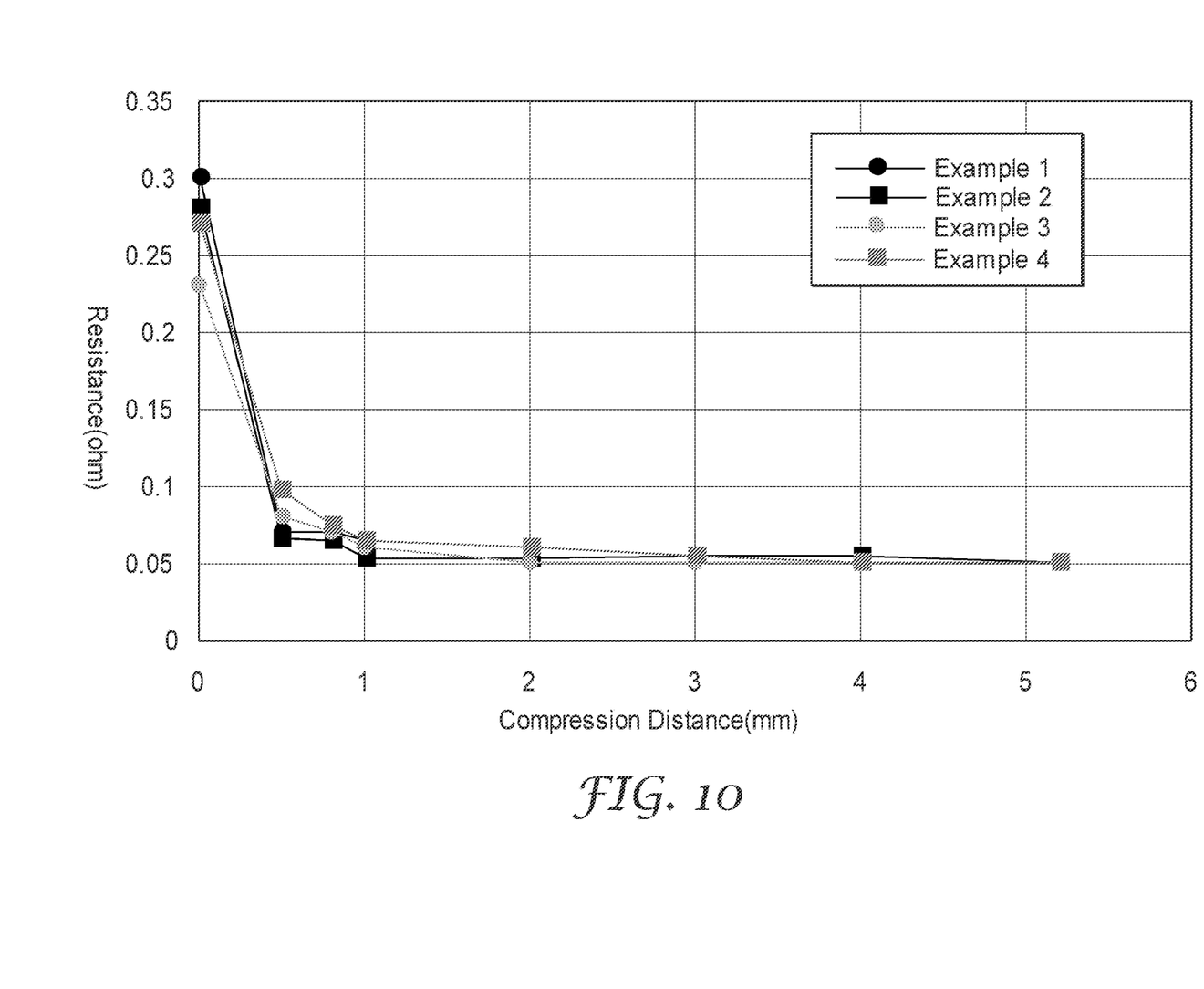
FIG. 10 is plot of the electrical resistance across a closed loop versus compression distance for several example gaskets.

The electrical resistance across the closed loop for various samples was measured for various compression distances (D0–D1 referring to FIGS. 2A-2B). FIG. 9 is plot of the resistance for Example 2 and Comparative Example C3 versus compression distance. FIG. 10 is a plot of the resistance for Examples 1-4 versus compression distance.

Additional multilayer film samples were made and first aged for about 3 days at temperature of about 85° C. and a relative humidity of about 85%. Then the multilayer film was wound to form a flexible closed loop having an outside diameter D0 of about 5.4 mm with the conductive layer forming an outside layer of the loop. The percent recovery after compressing to 0.2 mm for 1 minute, and after compressing with a 2 kg force for 1 minute, was then determined. The results are reported in the following table. The total backing thickness is the total thickness of the substrate (plastic backing layer) and the recovery layer.

| Example | Recovery Layer Formula | Substrate | Total Backing Thickness (μm) | Force to press to 0.2 mm (kg) | Recovery After Pressed to 0.2 mm | Recovery After Pressed with 2 kg |
|---|---|---|---|---|---|---|
| C4 | none | Fabric | 27 | 0.23 | 47% | 41% |
| C5 | none | Fabric | 28 | 0.25 | 45% | 42% |
| 5 | B | 12 μm PET | 23 | 0.32 | 71% | 66% |
| 6 | B | 12 μm PET | 25 | 0.29 | 72% | 68% |
| 7 | C | 12 μm PET | 26 | 0.23 | 65% | 59% |
| 8 | C | 12 μm PET | 27 | 0.31 | 66% | 58% |
| 9 | D | 12 μm PET | 30 | 0.75 | Deformed | |
| 10 | D | 12 μm PET | 27 | 0.83 | Deformed | |

Additional samples were made as described above but with different backing thicknesses. The substrate was PET. The percent recovery after compressing to 0.6 mm for 1 minute and after compressing with a 2 kg force for 1 minute was then determined. The results are reported in the following table.

| Example | Recovery Layer Formula | Total Backing Thickness (μm) | Substrate Thickness (μm) | Force to press to 0.6 mm (kg) | Recovery After Pressed to 0.6 mm | Recovery After Pressed with 2 kg |
|---|---|---|---|---|---|---|
| 11 | B | 24 | 12 | 0.12 | 81.0% | 56.2% |
| 12 | C | 25 | 12 | 0.15 | 83.0% | 55.3% |
| 13 | B | 48 | 25 | 0.86 | 72.0% | 59.0% |
| 14 | C | 47 | 25 | 0.92 | 75.0% | 57.5% |
| 15 | B | 83 | 30 | 1.25 | 69.0% | 67.0% |
| 16 | C | 85 | 30 | 1.37 | 67.0% | 63.0% |

Figure 11:
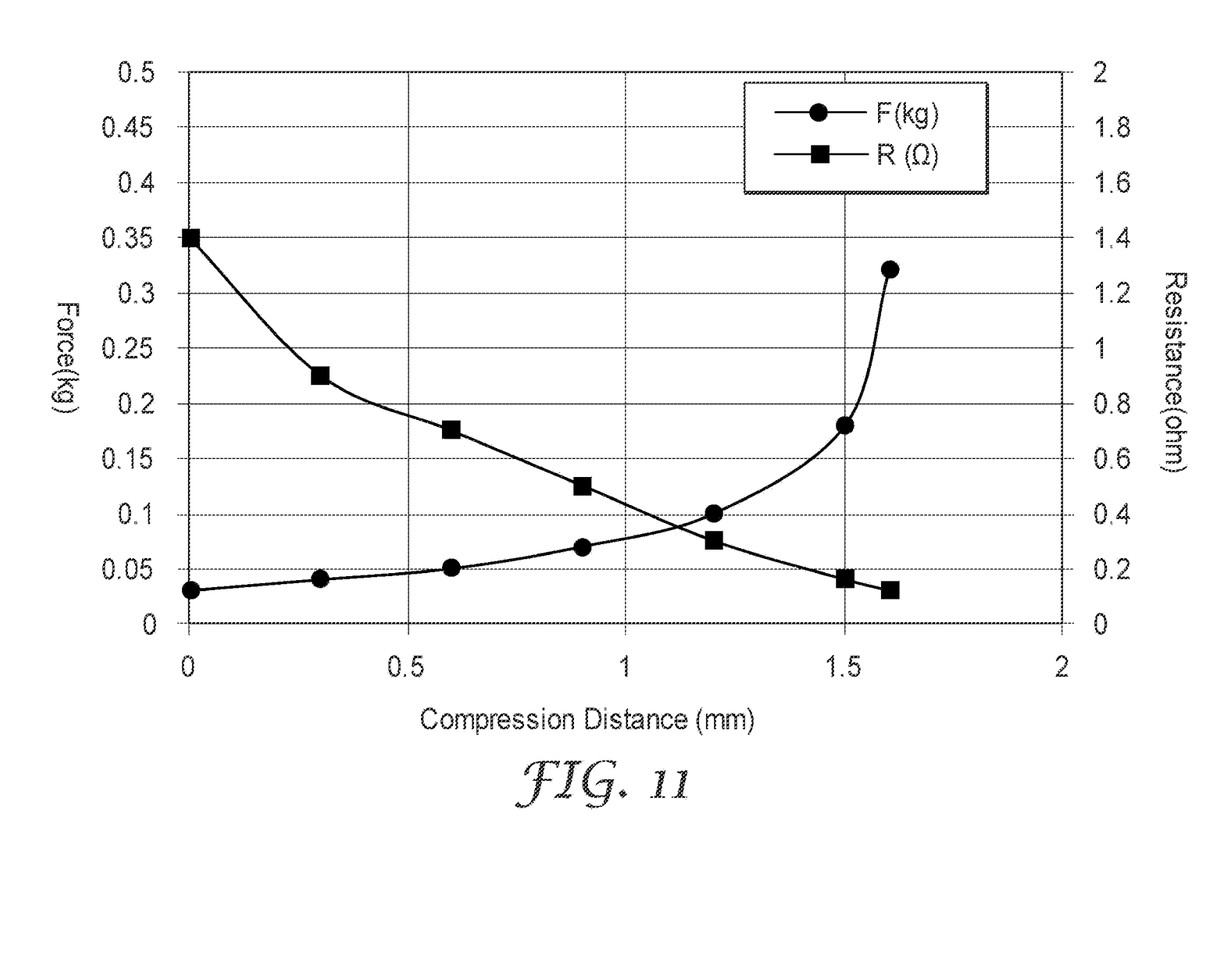
FIG. 11 is a plot of the force to compress a gasket to a given compression distance and the resulting electrical resistance across the gasket.

A multilayer film sample w*as formed into a hollow-gasket (e.g., as schematically illustrated in FIG. 2A) having an outer diameter of about 1.8 mm and the force to compress the gasket to a given compression distance and the resulting resistance across the loop at the given compression distance were determined and is shown in FIG. 11. The film sample included 12 micrometer thick PET coated with Recovery Layer Formulation B such that the total backing thickness (PET plus recovery layer) was 24 micrometers. The force to press the loop to 0.2 mm was 0.32 kg, the recovery after pressing the loop to 0.2 mm for 1 minute was 71.0%, and the recovery after pressing the loop with 2 kg for 1 minute was 55.2%.

Additional multilayer film samples were made as described above. Hollow loop gaskets similar to that depicted in FIG. 6A were formed by bending a multilayer film sample into a loop shape and bonding ends of the multilayer film together to form a closed loop. A PET substrate having a thickness of 12 μm and Recovery Formula B,%% as used. The percent recovery after compressing 85% for 1 minute and allowing 1 minute for recovery was determined. The percent recovery after compressing with 2 kg for 1 minute and allowing 2 minutes for recovery was determined. The force to compress to a 0.8 mm, the diameter after compressing with 2 kg, and the resistance after compressing 85% were determined. The results are reported in the following table.

| Ex. | Total Backing Thick. (μm) | Initial Loop Dia. (mm) | Force at 0.8 mm Compres. (kg) | Recovery After 85% Compres. | Recovery After Pressed with 2 kg | Dia. with 2 kg (mm) | R at 85% Compres. (ohm) |
|---|---|---|---|---|---|---|---|
| 17 | 28 | 4.21 | 0.07 | 81.0% | 51.3% | 0.15 | 0.26 |
| 18 | 29 | 4.25 | 0.10 | 79.5% | 51.1% | 0.16 | 0.25 |
| 19 | 28 | 4.26 | 0.08 | 81.2% | 51.6% | 0.16 | 0.28 |
| 20 | 27 | 4.25 | 0.10 | 77.4% | 52.0% | 0.16 | 0.25 |
| 21 | 27 | 4.25 | 0.11 | 80.7% | 52.7% | 0.15 | 0.26 |
| 22 | 31 | 4.23 | 0.12 | 79.7% | 52.7% | 0.16 | 0.22 |
| 23 | 28 | 4.23 | 0.09 | 78.3% | 53.2% | 0.16 | 0.25 |

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. An electrically conductive multilayer film for providing an electrical path between two conductive surfaces, comprising:
   a plastic backing layer;
   an electrically conductive layer disposed on a first side of the plastic backing layer; and
   a recovery layer disposed on an opposite second side of the plastic backing layer, such that an average thickness of the multilayer film is less than about 100 microns, and when the multilayer film is wound to form a flexible closed loop having an outside diameter of no more than about 7 mm with the conductive layer forming an outside layer of the loop, a resistance of the closed loop across a diameter of the closed loop remains less than about 2Ω when the loop is compressed across the diameter by at least 20%.

2. The electrically conductive multilayer film of claim 1, wherein the resistance of the closed loop across the diameter of the closed loop changes by less than about 50% when the compression of the loop is changed from about 20% to about 50%.

3. The electrically conductive multilayer film of claim 1, wherein a compression force per unit length of the loop of less than about 16 kg/m applied across the diameter along the length of the loop, compresses the loop across the diameter by more than about 80%.

4. The electrically conductive multilayer film of claim 1, wherein the closed loop regains at least 40% of its initial diameter after a force compressing the closed loop across the initial diameter by more than about 50%.

5. The electrically conductive multilayer film of claim 1, wherein the closed loop regains at least 40% of its initial diameter after a compression force per unit length of the closed loop of about 79 kg/m applied across the initial diameter of the closed loop along the length of the closed loop is removed.

6. The electrically conductive multilayer film of claim 1, wherein the resistance of the closed loop across a diameter of the closed loop remains less than about 1Ω when the loop is compressed across the diameter by at least 20%.

7. The electrically conductive multilayer film of claim 1, wherein the electrically conductive layer comprises one or more of copper, nickel, silver, aluminum, gold, indium tin oxide (ITO), and tin.

8. The electrically conductive multilayer film of claim 1, wherein the recovery layer comprises an acrylic polymer.

9. A hollow gasket formed by winding a multilayer film in a shape of a flexible hollow loop and bonding first and second portions of opposing first and second sides of the multilayer film to each other to form a flexible hollow closed loop, the multilayer film having an average thickness less than about 40 microns and comprising:
   an electrically conductive layer forming an outermost layer of the closed loop; and
   a recovery layer disposed on the conductive layer and comprising an acrylic polymer, such that the hollow gasket regains at least 40% of its initial diameter after a force compressing the gasket across the initial diameter by more than about 50% is removed,
   wherein the acrylic polymer comprises a reaction product of a composition, the composition comprising a cross-linking agent and either:
   a cyclic side-chain acrylate and an acrylic block copolymer; or
   a radical polymerizable acid and a free radical polymerizable base.

10. The hollow gasket of claim 9, wherein the first and second portions are adjacent respective first and second opposing edges of the multilayer film.

11. The hollow gasket of claim 9, wherein the first portion is adjacent a first edge of the multilayer film and an opposing second edge of the multilayer film is spaced apart from the second portion by a distance greater than a width of the second portion.

12. The hollow gasket of claim 9, wherein the composition comprises the cyclic side-chain acrylate and the acrylic block copolymer.

13. The hollow gasket of claim 9, wherein the composition comprises the radical polymerizable acid and the free radical polymerizable base.

14. A hollow gasket formed by bending a multilayer film in a shape of a flexible hollow loop and bonding first and second portions of a same side of the multilayer film to each other to form a flexible hollow closed loop, the multilayer film having an average thickness less than about 40 microns and comprising:
   an electrically conductive layer forming an outermost layer of the closed loop; and a recovery layer disposed on the conductive layer and comprising an acrylic polymer, such that the hollow gasket regains at least 40% of its initial diameter after a force compressing the gasket across the initial diameter by more than about 80% is removed, wherein the acrylic polymer comprises a reaction product of a composition, the composition comprising a crosslinking agent and either:

a cyclic side-chain acrylate and an acrylic block copolymer; or a radical polymerizable acid and a free radical polymerizable base.

15. The hollow gasket of claim 14, wherein the composition comprises the cyclic side-chain acrylate and the acrylic block copolymer.

16. The hollow gasket of claim 14, wherein the composition comprises the radical polymerizable acid and the free radical polymerizable base.

17. An electronic device, comprising:

electrically conductive first and second surfaces spaced apart along a first direction and facing each other; and a first compressed cylinder disposed between the first and second surfaces, the first compressed cylinder extending along a longitudinal second direction orthogonal to the first direction and comprising an electrically conductive external layer disposed on an electrically insulative internal layer comprising a reaction product of a composition comprising a cyclic side-chain acrylate, an acrylic block copolymer, and a crosslinking agent, wherein the external layer provides an electrically conductive path between the first and second surfaces by virtue of making electrical and physical contact with the first and second surfaces, the first compressed cylinder having an outer dimension D1 along the first direction and a longer outer dimension D3 along a third direction orthogonal to the first and second directions, $D3/D1 \geq 1.2$.

18. A hollow gasket formed by winding a multilayer film in a shape of a flexible hollow loop and bonding first and second portions of opposing first and second sides of the multilayer film to each other to form a flexible hollow closed loop, the multilayer film having an average thickness less than about 40 microns and comprising:

an electrically conductive layer forming an outermost layer of the closed loop; and a recovery layer disposed on the conductive layer and comprising an acrylic polymer, such that the hollow gasket regains at least 40% of its initial diameter after a force compressing the gasket across the initial diameter by more than about 50% is removed, wherein the first portion is adjacent a first edge of the multilayer film and an opposing second edge of the multilayer film is spaced apart from the second portion by a distance greater than a width of the second portion.

* * * * *